(12) United States Patent
Kato et al.

(10) Patent No.: US 6,653,731 B2
(45) Date of Patent: Nov. 25, 2003

(54) SEMICONDUCTOR DEVICE AND METHOD FOR FABRICATING SAME

(75) Inventors: Yoshimasa Kato, Tokyo (JP); Masamoto Tago, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/784,490

(22) Filed: Feb. 15, 2001

(65) Prior Publication Data

US 2001/0018229 A1 Aug. 30, 2001

(30) Foreign Application Priority Data

Feb. 28, 2000  (JP) ........................................ 2000-051873

(51) Int. Cl.[7] .............................................. H01L 23/12
(52) U.S. Cl. ........................ 257/737; 257/738; 257/778; 257/791; 438/613; 438/108
(58) Field of Search ................................ 257/737, 738, 257/778, 791–794; 438/108, 613

(56) References Cited

U.S. PATENT DOCUMENTS

| 5,989,982 | A | | 11/1999 | Yoshikazu | |
| 6,150,194 | A | * | 11/2000 | Sakaguchi et al. | 438/118 |
| 6,204,564 | B1 | * | 3/2001 | Miyata et al. | 257/778 |

FOREIGN PATENT DOCUMENTS

| JP | 2-170552 | 7/1990 |
| JP | 5-74934 | 3/1993 |
| JP | 8-70081 | 3/1996 |
| JP | 10-135252 | 5/1998 |
| JP | 10-150119 | 6/1998 |
| JP | 11-121507 | 4/1999 |
| JP | 2000-138316 | 5/2000 |
| JP | 2001-118953 | 4/2001 |

OTHER PUBLICATIONS

Japanese Office Action Mailed Apr. 1, 2003 (w/English translation of relevant portions).

* cited by examiner

*Primary Examiner*—Matthew Smith
*Assistant Examiner*—Belur V Keshavan
(74) *Attorney, Agent, or Firm*—Dickstein, Shapiro, Morin & Oshinsky, LLP

(57) ABSTRACT

A top surface of a LSI chip having a structure of a bare chip is provided with bumps, and a protective resin is provided for at least side surfaces of the LSI chips. The LSI chip is prevented from being chipped off or cracked because of protective resin provided for the side surfaces of the LSI chip. The invention provides a semiconductor device and a method for fabricating the same, in which the chip or a package thereof is prevented from being damaged, and thereby yield rate of the semiconductor device can be heightened. Since the numbers of the parts of the semiconductor device and the steps of using jigs and tools necessary for the fabrication process are reduced, fabricating cost of the semiconductor device can be cut down.

5 Claims, 12 Drawing Sheets

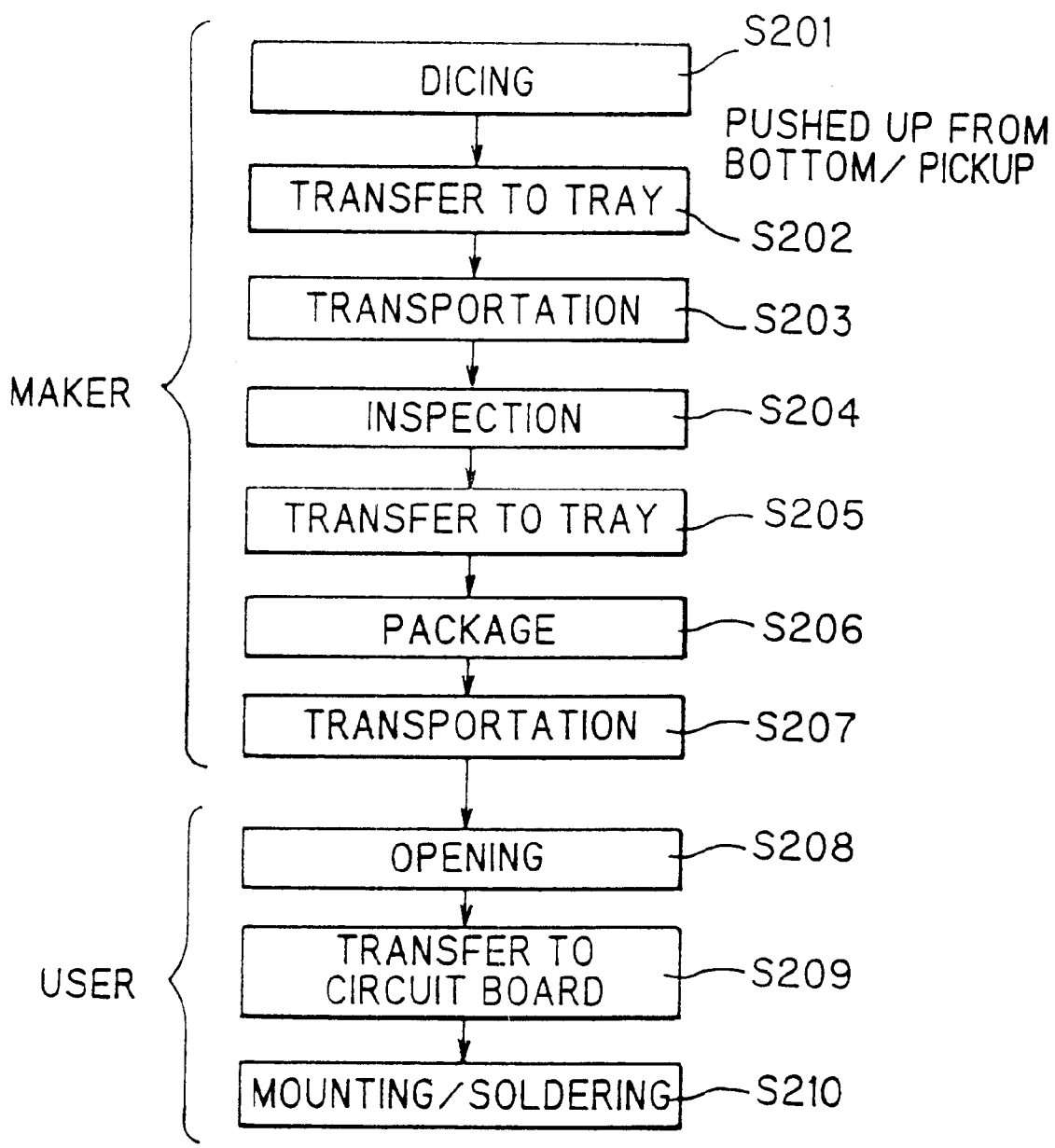

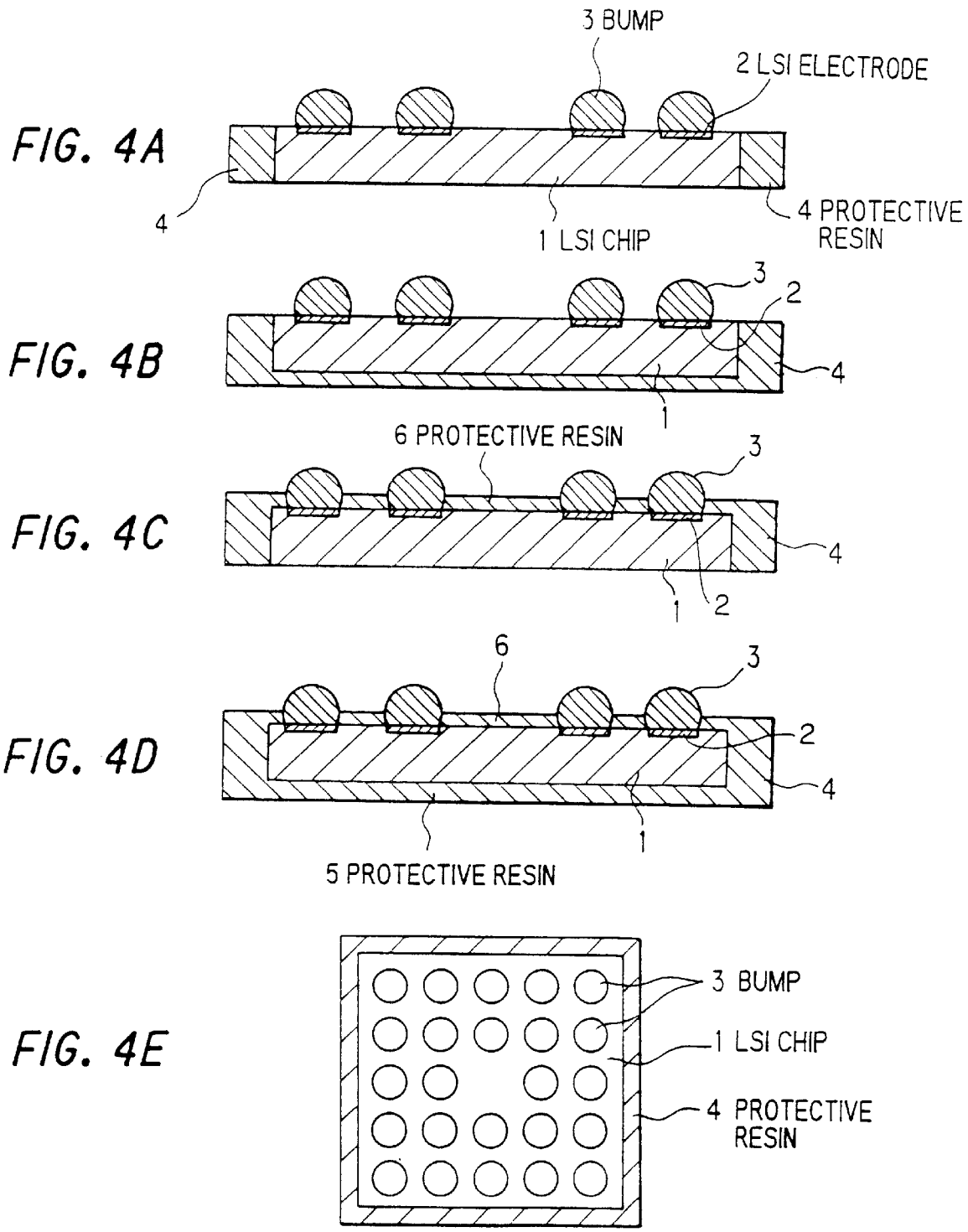

SEMICONDUCTOR DEVICE AND METHOD FOR FABRICATING SAME

FIELD OF THE INVENTION

The invention relates to a semiconductor device and a method for fabricating the same, and especially to a semiconductor device in which a bare chip is coated with protective resin and prevented from being cracked and a method for fabricating the same.

BACKGROUND OF THE INVENTION

Since a bare chip is provided with plural bumps serving as electrodes on an obverse surface thereof and not coated with protective resin, a space necessary for mounting it is small. Accordingly, the bare chip is suited for an electronic instrument in which the space for accommodating parts is limited, such as a portable telephone.

FIG. 1 shows a conventional semiconductor device (a bare chip).

An insulating layer 102 is provided for an obverse surface of a LSI chip 1, and a wiring layer 104 having LSI electrodes 103 thereon is formed on the insulating layer 102. Plural bumps 105 serving as external electrodes are mounted on leading ends of the LSI electrodes 103 formed on a circuit area 106.

FIG. 2 shows the steps of a process for fabricating the conventional semiconductor device shown in FIG. 1.

FIG. 3A shows a plan view of the wafer, which is not yet diced into the bare chips. FIG. 3B shows a cross-sectional view of the bare chip. FIG. 3A corresponds to a prior treatment of the step 201. The steps of the fabrication process ranging from dicing to mounting will be explained referring to FIGS. 2, 3A, 3B. "S" in FIG. 2 means the step.

As shown in FIG. 3A, the wafer is diced along boundary lines (broken lines) between the LSI chips 101, and the individuated semiconductor devices (the bare chips) 100 are obtained. After the wafer is diced into the semiconductor device 100 (S201), the semiconductor devices of a predetermined number are transferred to a tray (S202). Each semiconductor device 100 in the tray is supported by a jig on the inside of a crack permissible areas 107 so that circuit surfaces and the bumps 105 are not brought into contact with the tray, wherein the crack permissible area means a frame-shaped region ranging from edges of the LSI chip 101 to exterior electrodes on the same, and a width thereof is about 50 μm. The tray is carried to the step of inspecting the semiconductor devices by means of a transportation jig for exclusive use (S203). After the step of inspecting the semiconductor devices 100 is over (S204), the semiconductor devices 100 are again transferred to the tray (S205), carried to the step of packing the semiconductor devices 100, and packed up (S206). Thereafter, the package is transported to the user (S207). The user opens the package delivered in this way (S208), transfers the semiconductor devices to a transportation jig (S209), mounts the semiconductor devices 100 on a printed circuit board by means of a pickup tool, and connects the bumps 105 with wirings by reflow soldering (S210).

However, according to the aforementioned semiconductor devices, since the individuated semiconductor devices are transferred to the tray and transported in condition that they are contained therein, there is a possibility that a shock may exert on the semiconductor devices, particularly in cases where they are brought into contact with the tray at the time of transportation or the jig at the time of inspection. In such a case, the semiconductor device is apt to be cracked or broken off, and the electrodes or the circuit area may be damaged. Especially, the edges of the chip are apt to be cracked and broken off. This leads to a deterioration of the yield rate of the products and or quality of the transported semiconductor devices.

SUMMARY OF THE INVENTION

Accordingly, it is an object of the invention to provide a semiconductor device and a method for fabricating the same, in which a semiconductor device is prevented from being cracked, yield rate thereof is improved, and quality of forwarded products is guaranteed.

According to the first feature of the invention, the semiconductor device comprises:
 a bare chip fabricated as a large scale integrated circuit,
 plural bumps provided for an obverse surface of the bare chip, and
 protective members formed on at least side surfaces of the bare chip.

According to the aforementioned structure, a protective member provided for at least side surfaces of a bare chip reduces an external force exerted on a chip, and especially prevents corners of a chip from being cracked or broken off. As a result, defects occurring at the time of transportation or mounting, imperfections in joints occurring at the time of mounting, etc. are reduced, hence the semiconductor device can be small-sized and reliability thereof can be heightened.

According to the second feature of the invention, a method for fabricating the semiconductor device comprises the steps of:
 sticking a wafer on which plural bumps are formed to an adhesive sheet,
 dicing the wafer into individuated chips so as not to dice the adhesive sheet,
 forming spacings having predetermined widths between the individuated chips stuck to the adhesive sheet,
 coating the spacings formed between the individuated chips with resin,
 hardening the resin to unify the individuated chips like a wafer, and
 providing separate chips by dicing the unified chips along boundary lines between the individuated chips.

According to the aforementioned method, since the wafer on which plural bumps are formed is stuck to the adhesive sheet, it becomes possible to expand the adhesive sheet after the wafer is diced, and thereby the spacings between the chips which are wide enough to be coated with resin can be formed. When resin is hardened after the spacings are coated with resin, the chips unified like a wafer can be formed. The individuated chips, each of which is coated with resin at the side surfaces thereof, can be obtained by dicing the unified chips along the boundary lines between the chips. Accordingly, since the separated chips do not through the fabrication process, the steps of handling the chips can be eliminated, the number of the steps of using jigs and tools is reduced, and a metallic mold used in the step of molding resin becomes unnecessary. Then, the method for fabricating the semiconductor device is simplified. Moreover, since the LSI chip is prevented from being cracked by providing protective resin for the side surfaces thereof, reliability and yield rate of the products can be heightened. Stillmore, since the specific character of the bare chip is maintained, the number of parts does not increase, the semiconductor device can be small-sized, and cost thereof can be cut down.

According to the third feature of the invention, a method for fabricating the semiconductor device comprises the steps of:

sticking a wafer on which intermediate electrodes for mounting bumps thereon are arranged in accordance with a circuit pattern to an adhesive sheet, dicing the wafer into individuated chips so as not to dice the adhesive sheet, forming spacings between the individuated chips stuck to the adhesive sheet, coating the spacings formed between the individuated chips and a surface of the wafer on which the intermediated electrodes are arranged with resin, hardening the resin to unify the individuated chips like a wafer, grinding an obverse surface of the unified chips to expose the intermediate electrodes, and providing separate chips by dicing the unified chips along boundary lines between the individuated chips.

According to the aforementioned method, the intermediate electrodes formed on a circuit pattern on the wafer have function of adjusting the height of the bumps above the chip surface and relaxing external forces exerting on the semiconductor device. Since the wafer on which the intermediate electrodes are formed is stuck to the adhesive sheet, the adhesive sheet can be expanded after the wafer is diced, and the spacings, which are wide enough to be coated with protective resin, can be formed between the individuated chips. If the spacings are coated with protective resin which is hardened thereafter, the chip are unified like a wafer. After the bumps are respectively mounted on the intermediate electrodes formed on the chips, the unified chips are diced along the boundary lines between the respective chips, and the separate LSI chips are completed. As mentioned in the above, since the separate chips do not pass through the fabrication process, the steps of handling the chips can be eliminated, the number of the steps of using jigs and tools is reduced, and the metallic mold used in the step of molding becomes unnecessary. Then, the fabrication process of the semiconductor device is simplified. Moreover, since the LSI chip is prevented from being cracked by providing protective resin for the side surfaces and the obverse surface of the LSI chip, reliability and yield rate of the products can be heightened. Stillmore, since the specific character of the bare chip is maintained, the number of parts does not increase, the semiconductor device can be small-sized, and cost thereof can be cut down.

BRIEF DESCRIPTION OF THE DRAWINGS

The invention will be explained in more detail in conjunction with appended drawings, wherein:

FIG. 2 is a flow chart for explaining the steps of fabricating a bare chip shown in FIG. 1, FIG. 4E is a top view of the first preferred embodiment shown in FIG. 4A.

DESCRIPTION OF THE PREFERRED EMBODIMENTS

Figure 1:
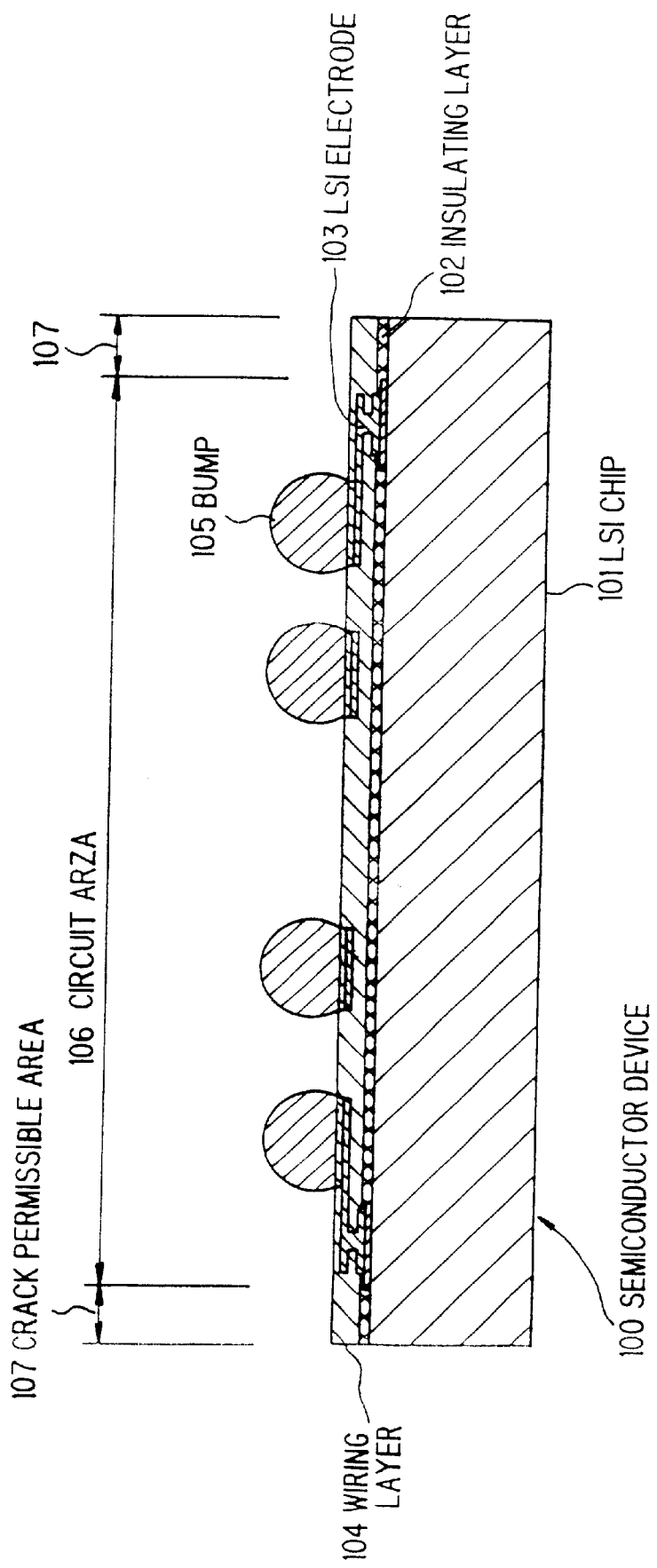
FIG. 1 is a cross-sectional view for showing a conventional semiconductor device.
Figure 3A:
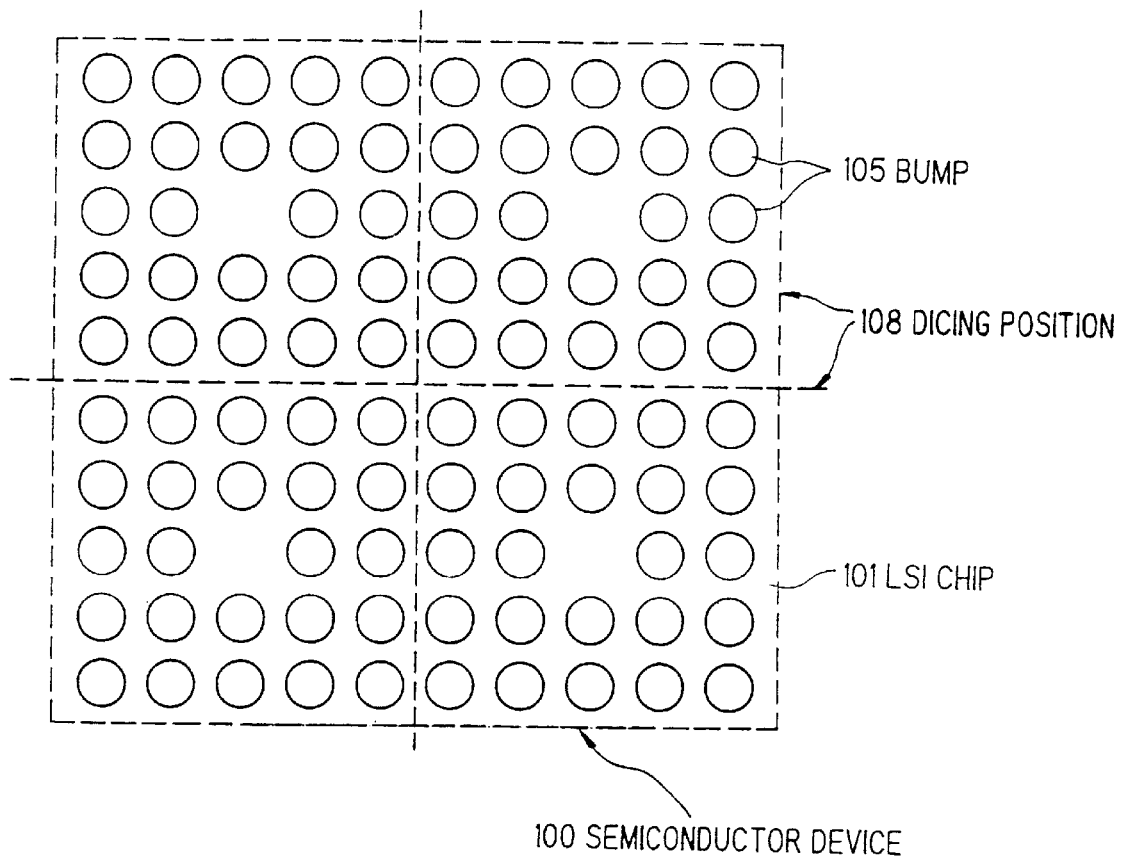
FIG. 3A is a plan view for showing a wafer before it is diced into bare chips.
Figure 3B:
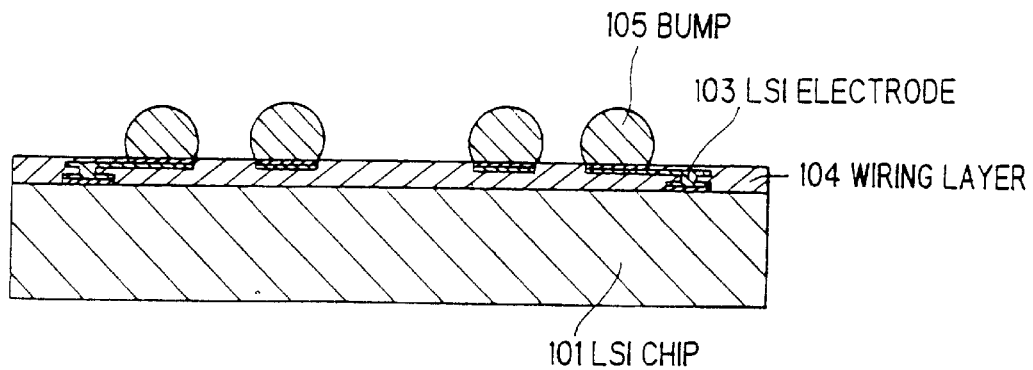
FIG. 3B is a cross-sectional view of a bare chip diced from a wafer shown in FIG. 3A, FIGS. 4A to 4D are cross-sectional views for showing the first to fourth preferred embodiments of the invention.

Hereafter, embodiments of the invention will be explained referring to the appended drawings.

FIGS. 4A to 4E show semiconductor devices according to the first to fourth preferred embodiments of the invention.

FIG. 4A shows the semiconductor devices according to the first preferred embodiments of the invention. As shown in FIG. 4E, a main part of the semiconductor device is a square-shaped LSI chip (a bare chip) 1, and an obverse surface thereof is provided with plural LSI electrodes 2 arranged two dimensionally at a predetermined pitch. A bump (a solder bump) 3 is mounted on each LSI electrode 2 so as to be connected with the outside as shown in FIG. 4E. Each side surface of the LSI chip 1 is coated with protective resin 4 having a predetermined thickness as shown in FIG. 4E. Resin of epoxy or silicone series having excellent adhesive or thermal property is suited for protective resin 4. Since the side surfaces of the LSI chip 1 are coated with protective resin 4, edges thereof are prevented from being damaged by a shock exerted thereon in case that the LSI chip 1 is inserted into or drawn out from a socket at the time of inspection of the semiconductor device or carrier by a mounter at the time of mounting. A thickness of protective resin 4 can be selected at will in a range 0.005 mm to 1.0 mm. In FIG. 4A, it is selected to be 0.5 mm for instance.

In case that the bare chip is used as the LSI chip, it is apt to be chipped off in a tray at the time of transportation or cracked at the time of handling in a mounting instrument. However, according to the embodiment shown in FIG. 4A, since the side surfaces of the LSI chip 1 is protected by protective resin 4, the LSI chip 1 is prevented from being chipped off or cracked. Moreover, since protective resin 4 is provided for the LSI chip 1 only at the side surfaces thereof, amount of resin can be reduced to the minimum, and a thin and small-sized semiconductor device can be obtained.

As mentioned in the above, according to the embodiment shown in FIG. 4A, since defects occurring at the time of transportation, imperfections in mounting or jointing, etc. in the fabrication process can be reduced, yield rate and reliability of the products can be improved. Moreover, since there is no necessity for using an interposer, such as a chip size package (CSP, hereinafter), the numbers of parts and the steps of the fabrication process can be reduced, the semiconductor device can be small-sized, and reliability thereof can be improved.

FIG. 4B shows the second preferred embodiment of the semiconductor device according to the invention. The feature of the second preferred embodiment is that protective resin 5 is provided for a reverse surface of the LSI chip 1 in addition to the structure shown in FIG. 4A. As a result, not only the side surfaces of the LSI chip 1 but also the reverse surface of the same can be protected from the outside. The strength of protective resin 4 is heightened by providing the protective resin 5. Moreover, when numerals for discrimination are stamped on the reverse surface of the semiconductor device, the stamped numerals can be recognized clearly. The thickness of protective resin 5 may be selected at will in a range 0.001 to 1.0 mm. The thickness of protective resin may be either the same as or different from that of the protective resin 4.

According to the structure shown in FIG. 4B, yield rate and reliability of the semiconductor device can be further improved. Since there is no necessity for using the interposer, such as the CSP, in this case also, the numbers of the parts of the semiconductor device and the steps of the fabrication process can be reduced.

FIG. 4C shows a semiconductor device according to the third preferred embodiment of the invention. A feature of this embodiment is that the obverse surface of the semiconductor device is coated with protective resin 6 except areas on which the bumps 3 are mounted (bump-mounting areas, hereinafter) in addition to the structure shown in FIG. 4A. Since protective resin 6 protects a surface under which circuit patterns are formed (a circuit surface, hereinafter) and fixes the bumps 3 to the LSI electrodes 2, reliability of the semiconductor device can be improved. The thickness of protective resin 6 may be selected at will in a range 0.005 to 0.5 mm, and the inventers confirm experimentally that a satisfactory result can be obtained in case that protective resin is 0.02 mm thick.

Although the chip is frequently chipped off in a tray at the time of transportation or cracked at the time of handling in a mounting instrument in case that the bare chip is used as the LSI chip 1, these defects are reduced according to the semiconductor device shown in FIG. 4C, because it is protected by protective resin 4, 6. Moreover, the circuit surface is protected against a mechanical shock exerting thereon, and the LSI electrode is prevented from being corroded by moisture absorption by providing protective resin 6 for the semiconductor device. As s result, according to this embodiment, since condemnations concerning the LSI chip 1, such as defects occurring in the tray at the time of transportation, imperfections in mounting or joint occurring at the time of fabrication, etc. can be reduced, yield rate of the products can be heightened, and a moisture-resisting property of the semiconductor device can be improved. Moreover, since there is no necessity for providing an interposer, such as a CSP, the numbers of parts and the steps of the fabrication process can be reduced.

FIG. 4D shows a semiconductor device according to the fourth preferred embodiment of the invention. This embodiment combines the feature of the structure shown in FIG. 4B with that of the structure shown in FIG. 4C. That is to say, the side surfaces of the LSI chip 1 are coated with protective resin 4, the bump-mounting surface of the same is coated with protective resin 6, and the reverse surface of the same is coated with protective resin 5. Accordingly, in the semiconductor device shown in FIG. 4D, all the surfaces of the LSI chip 1, that is to say, the side surfaces, the reverse surface and the bump-mounting surface are protected from the outside. In addition to that, since the moisture-resisting property of the LSI chip is improved, yield rate and reliability of the semiconductor device are further heightened. Moreover, the protective property of the semiconductor device against the damage caused by a shock which is exerted on the semiconductor device from a tool at the time of mounting or a socket at the time of a test for selecting the chips. Then, the semiconductor device can be treated as if an ordinarily packaged chip. Moreover, since the bumps 3 are reinforced, a value added of the semiconductor device is heightened. Since a interposer, such as a CSP, is not used, the number of parts and the steps of the fabrication process can be reduced.

Figure 5A:
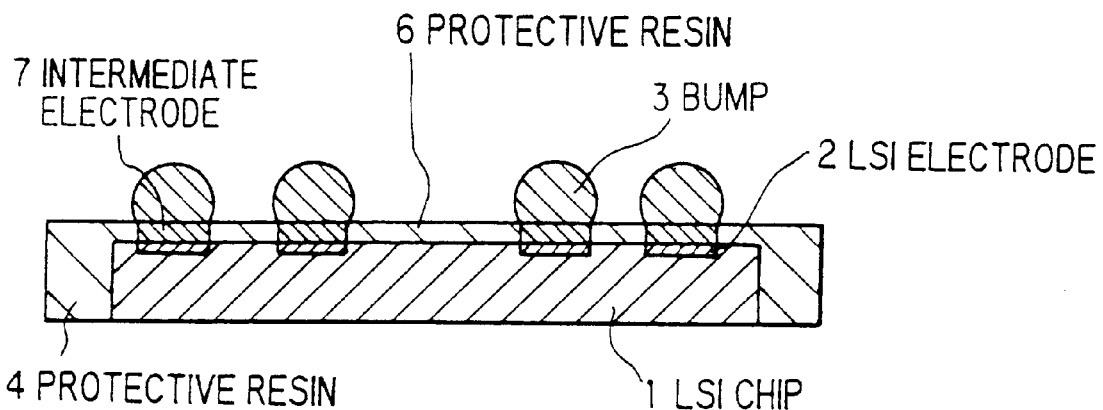
FIGS. 5A, 5B are cross-sectional views for showing the fifth to sixth preferred embodiments of the invention.
Figure 5B:
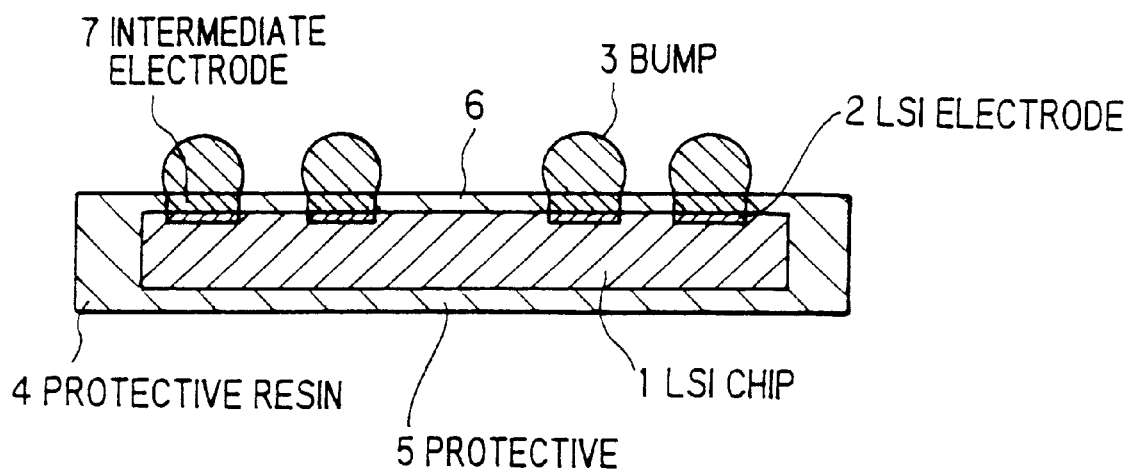

FIGS. 5A and 5B respectively show the semiconductor device according to the fifth and sixth preferred embodiments of the invention.

FIG. 5A shows the semiconductor device according to the fifth preferred embodiment of the invention. The feature of this embodiment is that it is provided with intermediate electrodes 7, each of which is inserted between the LSI electrode 2 and the bump 3 to combine them. Since the intermediate electrode 2 is provided for the LSI chip 1, an interval between the LSI electrode 2 and the bump 3 can be adjusted, and thereby the bump 3 is prevented from being imperfectly connected with an external circuit. Moreover, since concentration of stress on a joint of the bump 3 is relaxed by the intermediate electrode 7, reliability of the joint between the bump and a printed circuit board can be heightened.

Since the semiconductor device is protected by protective resin 4, 6, the edges of the LSI chip 1 are prevented from being damaged or cracked in case that the semiconductor device is inserted into or drawn out from a socket at the time of inspection, or shocked by a mounter at the time of a transfer in a mounting process. Moreover, since the intermediate electrode 7 is provided for the semiconductor device, stress 1 is relaxed and reliability of the joint of the bump 3 can be heightened. The thickness of the intermediate electrode 7 can be selected at will in a range 0.005 to 0.2 mm. As material of the intermediate electrode, not only Ni or Cu but also epoxy resin containing filler formed of Ag are used. Ni or Cu is plated with Au in order to increase wettability to the bump in most cases. When epoxy resin containing filler is used, Ni is put thereon, and Au is deposited on Ni.

FIG. 5B shows a semiconductor device according to the sixth preferred embodiment of the invention. The feature of this embodiment is that protective resin 5 is added to the reverse surface of the structure shown in FIG. 5A. Strength of protective resin 4 is heightened, because protective resin 5 is provided for the LSI chip 1 similarly to the semiconductor devices shown in FIGS. 4A, 4D. When reference numerals for discrimination is stamped on the reverse surface of the semiconductor device, the stamped numerals can be recognized clearly. The thickness of protective resin 5 may be selected at will in a range 0.005 to 1.0 mm. The thickness of protective resin 5 may be either the same as or different from that of protective resin 4. As explained in FIG. 5A, stress exerted on a joint from the outside is relaxed by providing the intermediate electrode 7, and reliability of the joint of the bumps can be heightened.

Next, methods for fabricating the aforementioned semiconductor devices will be explained.

Figure 6:
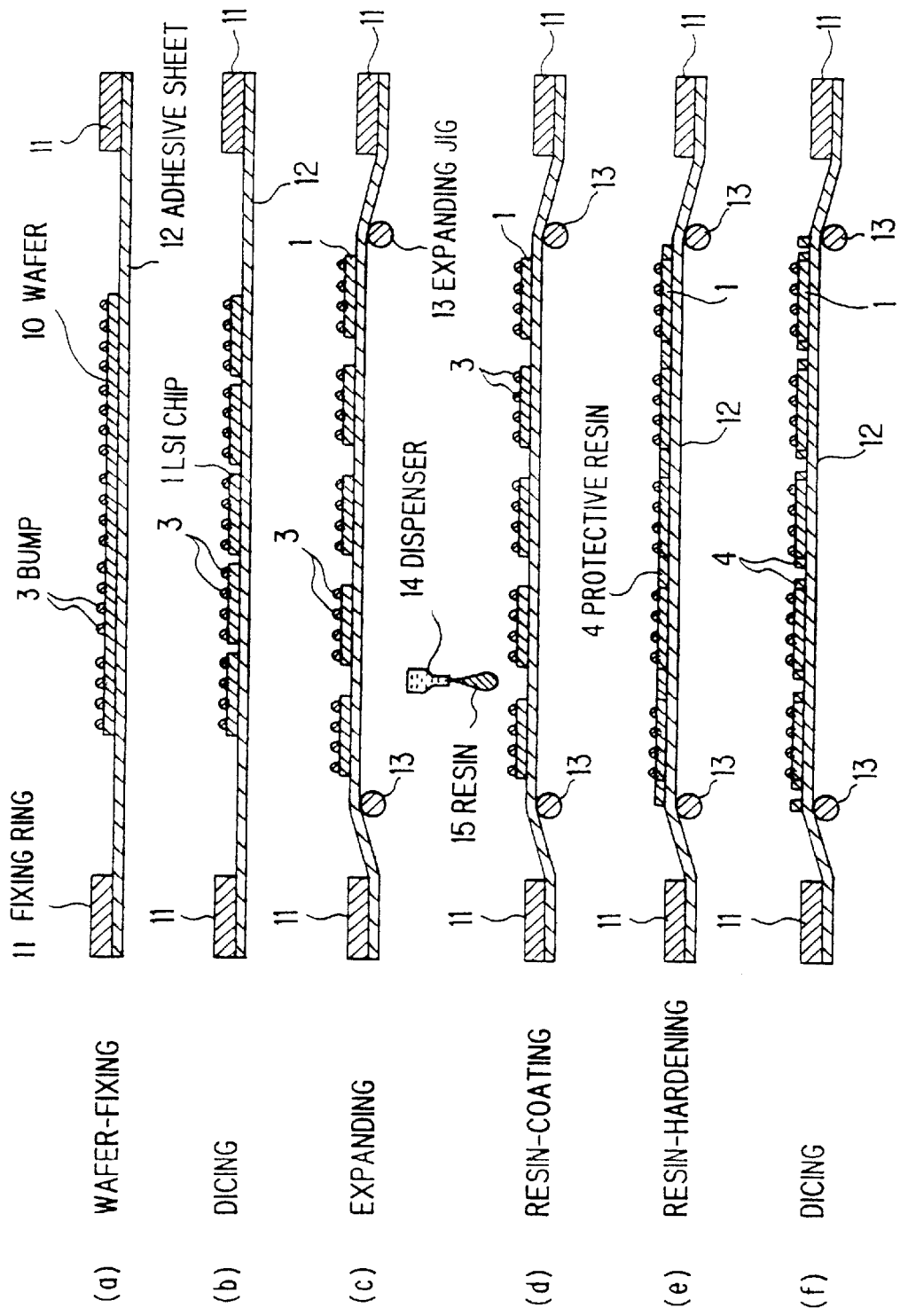
FIG. 6 shows the steps of fabrication processes of semiconductor devices shown in FIGS. 4A, 4C.

FIG. 6 shows the steps of the method for fabricating the semiconductor devices shown in FIGS. 4A, 4C.

The bumps 3 are previously formed on a wafer 10. The wafer 10 adheres to the adhesive sheet 12, an adhesive property of which is decreased by ultraviolet (UV) irradiation. Next, the adhesive sheet 12 is fixed to a fixing ring 11 as shown in the step (a) in FIG. 6 (FIG. 6(a), hereinafter similarly to the other steps of the respective methods mentioned later.) In this condition, only the wafer 10 is diced without dicing the adhesive sheet 12, and individuated into plural LSI chips 1 having predetermined dimensions.

Moreover, as shown in FIG. 6(c), after a ring-shaped expanding jig 13 is situated at a predetermined position which is near and lower than the fixing ring 11 for fixing the adhesive sheet 12, the expanding jig 13 is pushed up to expand the adhesive sheet 12 and extend spacings between the LSI chips 1 individuated by dicing.

Stillmore, resin 15 is dripped on the spacings between the LSI chips 1 by means of a dispenser 14 as shown in FIG. 6(d), and the spacings between the LSI chips 1 are filled with protective resin 4 as shown in FIG. 6(e). After resin 15 is hardened in this condition, the adhesive sheet 12 is diced along boundary lines between the LSI chips 1, and the separate LSI chips 1 having predetermined dimensions can be obtained (FIG. 6(f)). In order to obtain the semiconductor device having the structure shown in FIG. 4C, protective resin 6 may be molded on the sides of the bumps 3 in the state shown in FIG. 6(d). In this case, the intermediate electrode 7 may be inserted between the bump 3 and the LSI electrode 2. The LSI electrode 2 is prevented from being corroded because of moisture absorption by providing protective resin 6 having nearly the same height as that of the intermediate electrodes 7.

Hitherto, each of the individuated LSI chips is molded by resin after it is mounted on a lead frame or a substrate. However, in the state shown in FIG. 6(d), the steps of resin-coating to dicing are conducted by utilizing the jigs and the tools used at the time of dicing. That is to say, the steps of handling the individuated LSI chips 1 can be eliminated, and there is no necessity for using a metallic mold in the step of molding individuated LSI chip 1. Accordingly, the LSI chip is prevented from being cracked especially at cornered portions, and the number of the steps of using jigs and tools can be reduced.

The spacings between the LSI chips 1 can be extended not only by the expanding method shown in FIG. 6 but also by a method that the wafer 10 is diced by using a thicker blade than that used in the step shown in FIG. 6(f), in which the LSI chips unified like a wafer are diced after the spacings between the LSI chip 1 are coated with protective resin 4. The aforementioned methods may be combined. Although a dicing area can be minimized according to the expanding method, the advantage of the method in which the wafer Is diced by using the thick blade is that the wafer can be processed with higher accuracy.

Figure 7:
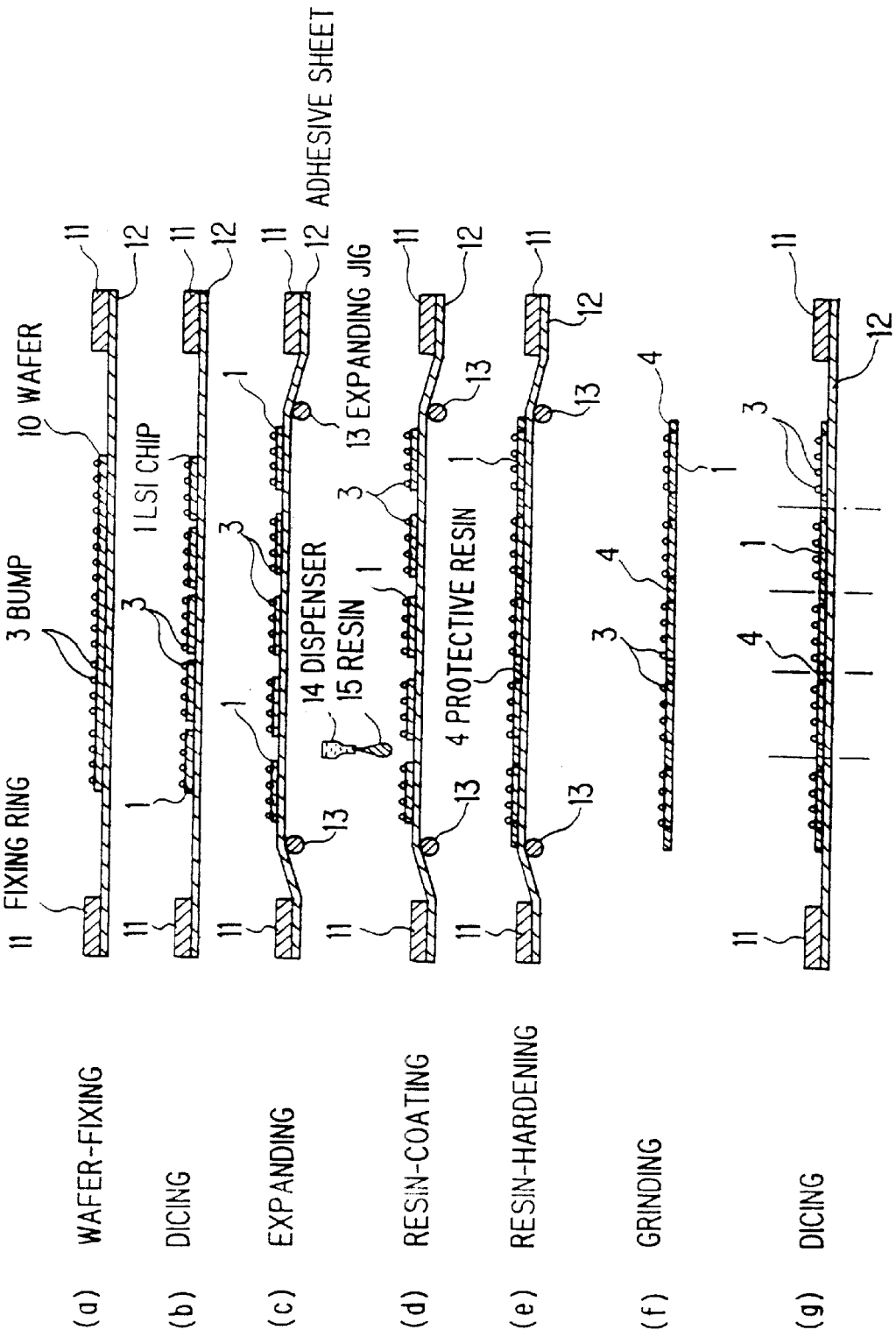
FIG. 7 shows a method for thinning semiconductor devices shown FIGS. 4A, 4C.

FIG. 7 shows a method for fabricating semiconductor devices shown in FIGS. 4A, 4C in case that thicknesses thereof are made thin.

Since the steps (a) to (e) shown in FIG. 7 are the same as those shown in FIGS. 6(a) to (e), the duplicated explanations will be omitted here. As shown in FIGS. 7(d), (e), the spacings between the individuated LSI chips 1 are coated with protective resin 4. After protective resin is hardened, the LSI chips 1 are unified like a wafer. Then, the unified LSI chip 1 are removed from the adhesive sheet 12, and a reverse surface thereof is grinded as shown in FIG. 7(f), wherein the step of grinding may be omitted. Next, the LSI chips 1 unified like a wafer are again fixed to the adhesive sheet 12 or the other adhesive sheet, diced along boundary lines (shown as chain lines in the drawing) between the individuated LSI chips and separated into the LSI chips (FIG. 7(g)). As a result, the semiconductor device shown in FIG. 4A can be obtained.

According to the method shown in FIG. 7, the thin semiconductor device can be fabricated by adding the step shown in FIG. 7(f), and ooze and dirt on the reverse surface can be excluded.

Similarly to the method shown in FIG. 6, the number of the steps of handling the individuated LSI chips can be eliminated, and there is no necessity for using a metallic mold in the step of resin-molding. In this way, the fabrication process of the semiconductor device is simplified. Accordingly, the LSI chip 1 can be prevented from being cracked, and the number of the steps of using jigs and tools are reduced.

Figure 8:
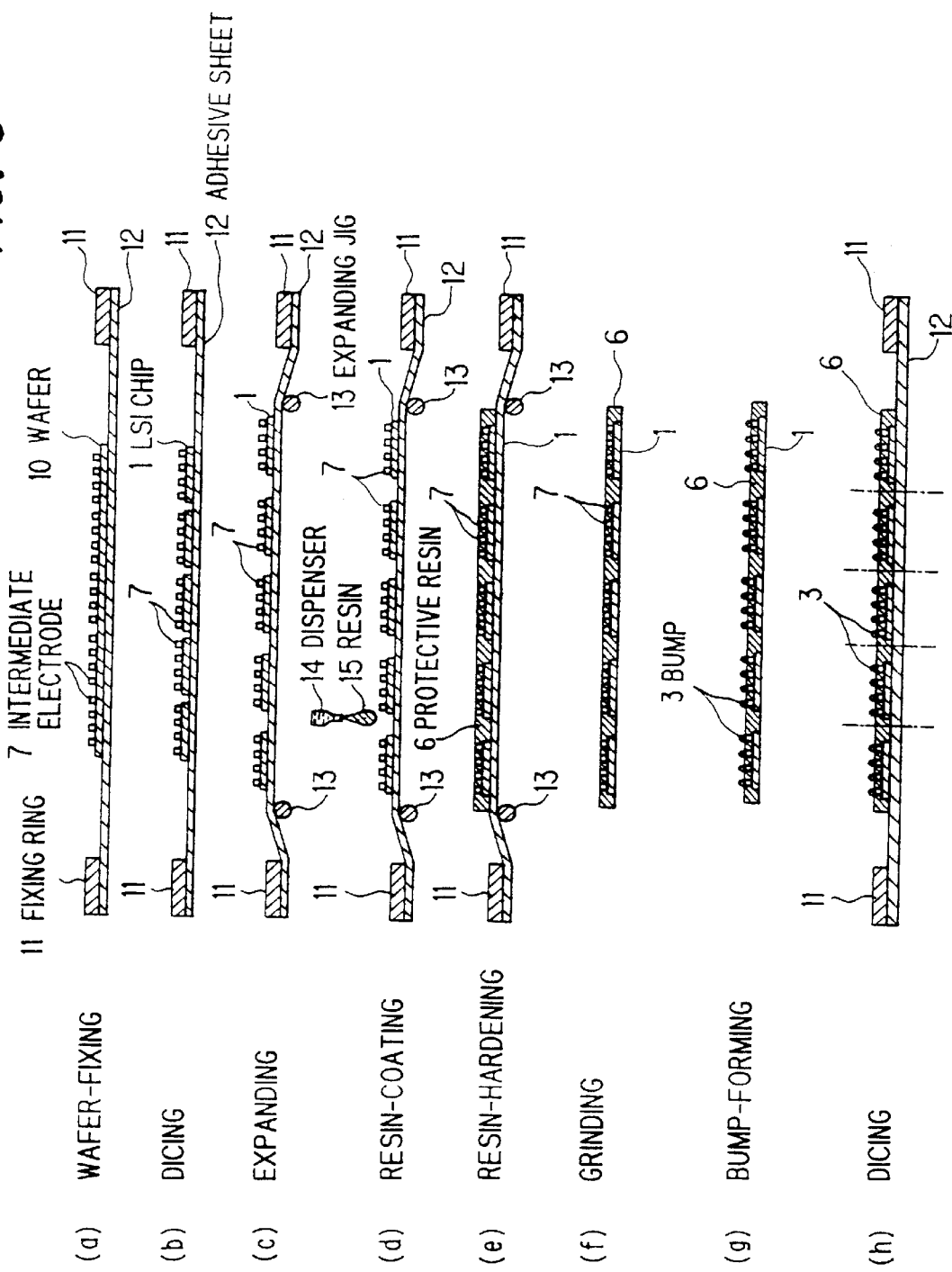
FIG. 8 shows a method for fabricating a semiconductor device shown in FIG. 5A.

FIG. 8 shows a method for fabricating a semiconductor device shown in FIG. 5A.

As shown in FIG. 8(a), intermediate electrodes 7 are previously formed on a wafer 7. The wafer 10 sticks to the adhesive sheet 12, an adhesive property of which is decreased by ultraviolet (UV) irradiation. The adhesive sheet 12 which adheres to the wafer 10 is fixed to the fixing ring 11. In this condition, the wafer 10 is diced along predetermined lines as shown in FIG. 8(b), and individuated into plural LSI chips 1. Next, after an expanding jig 13 is situated at a predetermined position which is near and lower than the fixing ring 11 as shown in FIG. 8(c), the expanding jig 13 is pushed up to expand the adhesive sheet 12, and spacings between the LSI chips 1 are extended.

Moreover, as shown in FIG. 8(d), liquid resin 15 is dripped on the intermediate electrodes 7 as well as the spacings between the LSI chips 1 by means of a dispenser 14 so that the intermediate electrodes 7 are coated with protective resin 4, 6. After protective resin 4, 6 are hardened, the LSI chips 1 unified like a wafer are removed from the adhesive sheet 12 as shown in FIG. 8(e), and the obverse surface of the unified LSI chips 1 is grinded to expose the intermediate electrodes 7 as shown in FIG. 8(f). In this case, the reverse surface of the unified LSI chips 1 may be grined also at need, and thereby the thickness of the semiconductor devices are determined. Subsequently, bumps 3 are respectively mounted on top surfaces of the intermediate electrodes 7 as shown in FIG. 8(g). Moreover, the unified LSI chips 1 on which the bumps 3 are mounted are fixed to the adhesive sheet 12, and diced along the boundary lines (shown as chain lines in the drawing) between the individuated LSI chips 1 coated with protective resin 4,6 into the separate chips having predetermined dimensions as shown in FIG. 8(h).

According to the method for fabricating the semiconductor device shown in FIG. 8, protective resin 4, 6 are coated collectively, and the thin semiconductor device provided with the intermediate electrodes 7 buried in resin can be fabricated easily. Moreover, semiprocessed goods can be handled as if a wafer throughout the almost whole fabrication process, and jigs necessary for operating the fixing ring can be wholly used as the jigs and the tools at the time of fabrication.

Accordingly, the thin semiconductor device provided with the intermediate electrodes 7 which contribute to the improvement of reliability of the semiconductor device can be fabricated in the lump according to the aforementioned method. Moreover, since there is no necessity for using a metallic mold which has been necessary in the conventional fabrication process at the time of transfer molding, a provision for fabricating the semiconductor device can be simplified, and the semiconductor device having almost the same dimensions as those of the LSI chip can be fabricated.

Figure 9:
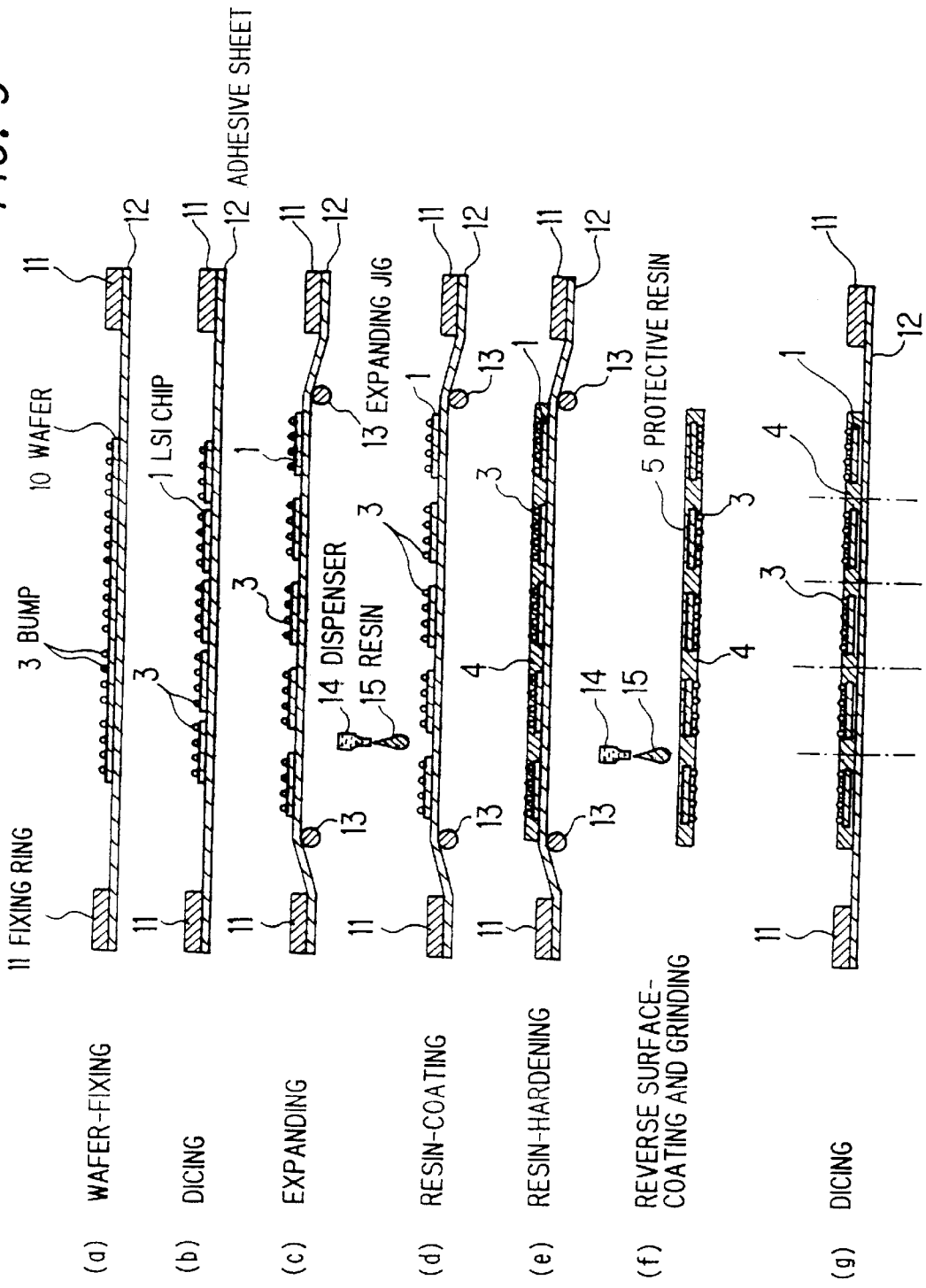
FIG. 9 shows a method for fabricating a semiconductor device shown in FIG. 4D.

FIG. 9 shows a method for fabricating a semiconductor device shown in FIG. 4D.

Since the steps shown in FIGS. 9(a) to (e) are the same as those shown in FIGS. 7(a) to (e), duplicated explanations will be omitted here. After resin is hardened in the step shown in FIG. 9(e), the unified LSI chips 1 are removed from the adhesive sheet 12, the unified LSI chips 1 are turned over, the reverse surface of the unified chips 1 is coated with resin 15 by means of a dispenser 14, and thereby protective resin 5 is formed thereon (FIG. 9(f)). After protective resin 6 is hardened, the surface is grined. Next, as shown in FIG. 9(g), the unified LSI chips 1 are again fixed to the adhesive sheet 12 or the other adhesive sheet, and diced along boundary lines (shown as chain lines in the drawing) between the individuated LSI chips 1 as shown in FIG. 9(g) Then, the semiconductor device shown in FIG. 4D is completed.

As mentioned in the above, since protective resin 4, 5, 6 are provided for the whole surfaces of the LSI chip 1 by a simple fabrication process, there is no necessity for using a metallic mold which has been necessary in the conventional method at the step of transfer molding. The provision for fabricating the semiconductor device can be simplified, and the semiconductor device having almost the same external dimensions as those of the LSI chip can be fabricated. Although resin is applied to the reverse surface of the LSI chip by means of a dispenser in the above explanations, other method for applying resin, such as spin coating, screen printing, roller application, showering, application by resin sheet, etc. may be adopted.

Figure 10:
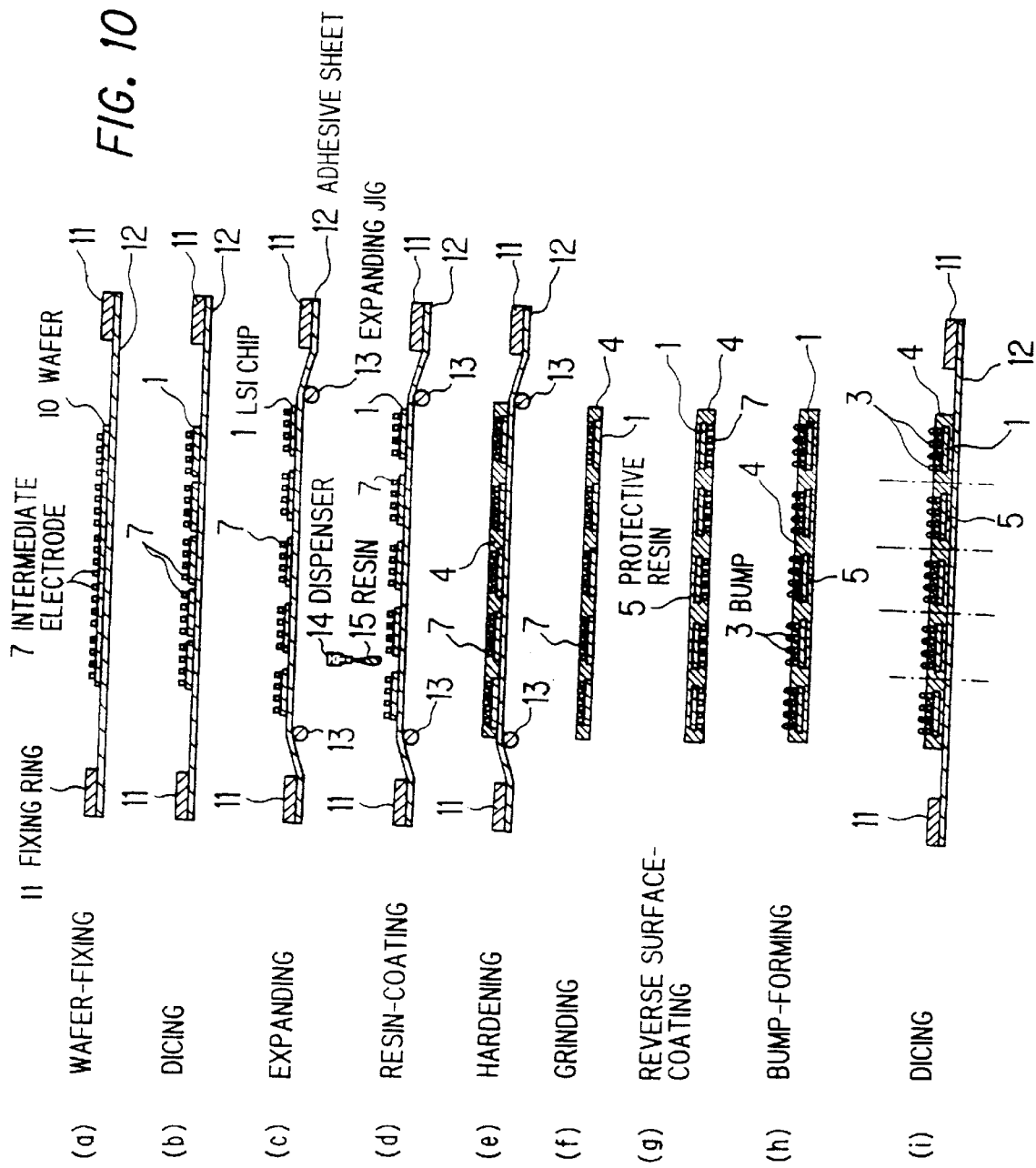
FIG. 10 shows a method for fabricating a semiconductor device shown in FIG. 5B.

FIG. 10 shows a method for fabricating the semiconductor device shown in FIG. 5B. Since the steps shown in FIGS. 10(a) to (f) are the same as those shown in FIGS. 8(a) to (f), duplicated explanations will be omitted here. After the step of grinding the unified LSI chips shown in FIG. 10(f) is conducted, the reverse surface of the unified LSI chips, which is opposite to the other surface mounting the intermediate electrodes 7 thereon, is coated with protective resin 5 as shown in FIG. 10(g). Subsequently, the bumps 3 are respectively mounted on the intermediate electrodes 7 as shown in FIG. 10(h). Thereafter, the unified LSI chips on which the bumps 3 have been mounted are again fixed to the adhesive sheet 12 or the other sheet, and diced into the separate LSI chips 1 along the boundary lines (the chain lines in the drawing) between the LSI chips as shown in FIG. 10(i). Since the method for fabricating the semiconductor device shown in FIG. 10 includes the step shown as (f), the thin semiconductor device can be fabricated, and ooze and dirt caused by resin can be excluded.

According to the method shown in FIG. 10, protective resin 4, 6 can be provided for the LSI chip 1 in the lump. Moreover, since the bumps 3 is mounted on the intermediate electrode 7 buried in resin, stress exerted on a joint between the bump 3 and the chip (not shown) is reduced, and the bumps 3 is prevented for being covered with protective resin 6. Stillmore, semiprocessed goods are handled as if wafer throughout almost the whole fabrication process, and all the jigs used in the step of fixing the rings can be used at the time of fabrication. Accordingly, the thin semiconductor device having improved reliability in jointing can be fabricated in the lump. Moreover, since semiprocessed goods can be handled as if a wafer in the aforementioned process, investment in the provision for fabricating the semiconductor device can be cut down, the jigs and the tools can be simplified, and cost of the semiconductor device can be reduced. The bumps can be formed by solder paste-printing and reflow soldering. The same purpose can be attained by solder ball-mounting, plating or evaporation.

Figure 11:
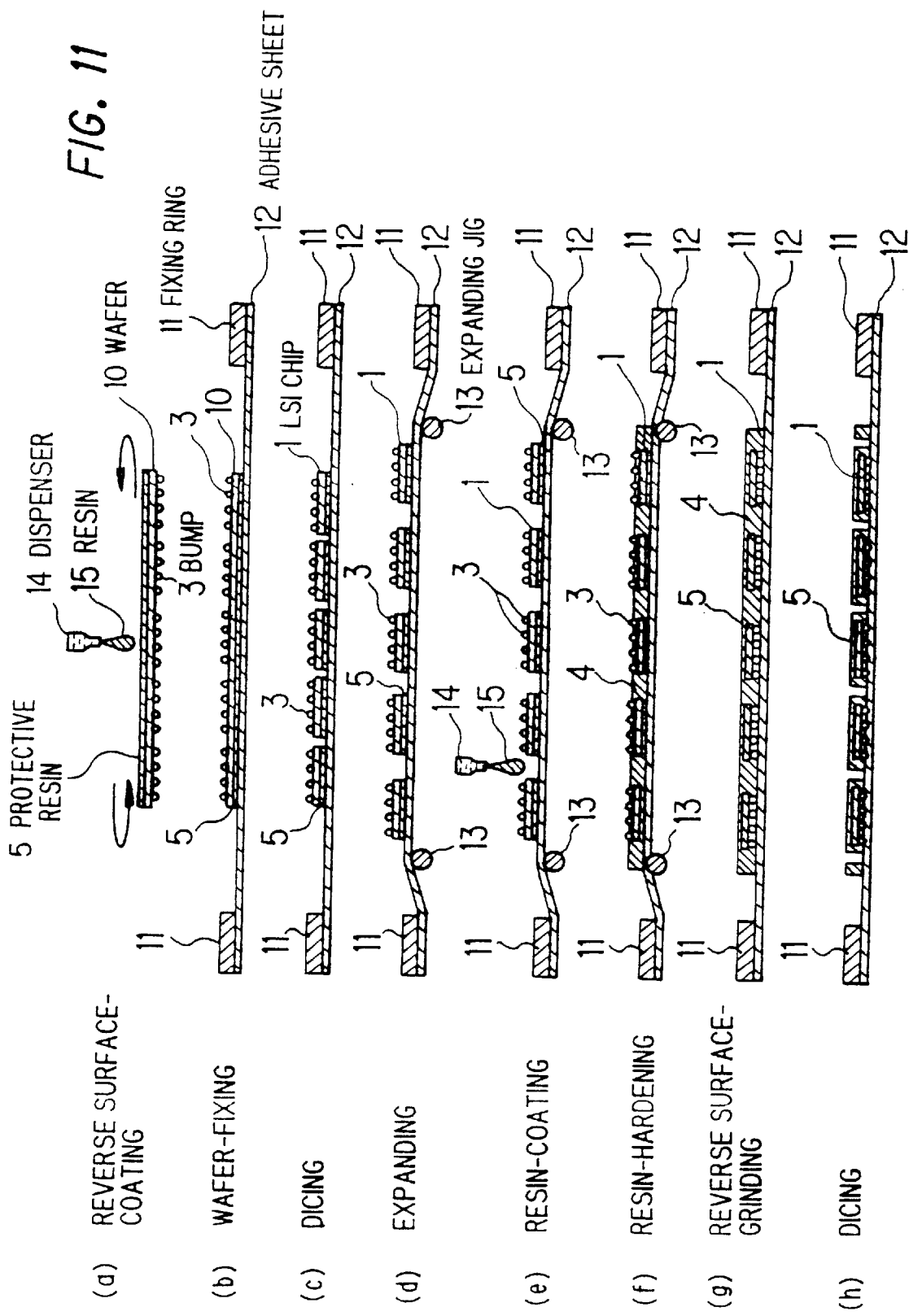
FIG. 11 shows a modification of a fabrication process shown in FIG. 9.

FIG. 11 shows a modification of the method shown in FIG. 9. The feature of this embodiment of the invention is that the reverse surface of the wafer is coated with resin before the wafer is fixed to the adhesive sheet dissimilarly to the other method in which the reverse surface is coated with resin after grinding.

As shown in FIG. 11(a), the reverse surface of the wafer 10, on which the bumps 3 are provided previously, is coated with resin 15 by means of a dispenser 14 to from a protective resin 5 in the first place. Although the dispenser 14 is used in the above explanation, any one of spin coating, screen printing, roller application, showering, application using a resin sheet, etc. may be adopted. Next, as shown in FIG. 11(b), the reverse surface of the wafer 10 on which protective resin 5 is coated is fixed to the adhesive sheet 12, to which the fixing ring 11 is fixed. Then, the wafer 10 is so diced that the adhesive sheet 12 is not diced, and individuated into the LSI chips 1 as shown in FIG. 11(c). Next, the expanding jig 13 which is situated in the inside of and lower than the fixing ring 11 is pushed up to expand the adhesive sheet 12 and extend the spacing between the LSI chips 1 as shown in FIG. 11(d). The spacings between the LSI chips 1 formed in this way are coated with resin 15 which is dripped from the dispenser 14 to form protective resin 4 as shown in FIG. 11(e). After protective resin 4 is dried in this condition as shown in FIG. 11(f), the LSI chips 1 unified like a wafer are removed from the adhesive sheet 12, turned over, and fixed to the adhesive sheet 12. Then, the reverse surface coated with protective resin 5 is grined as shown in FIG. 11(g). Thereafter, the unified LSI chips 1 are diced along the boundary lines between the LSI chips 1, and the separate LSI chips 1 can be obtained. The effect of this embodiment is the same as that shown in FIG. 9.

Finally, reliability of the semiconductor device according to the invention shown in FIG. 4A is compared with that of the conventional semiconductor device (the bare chip) shown in FIG. 1, supposing a condition that the semiconductor devices are packed up and transported. In case that protective resin 4 is removed from the semiconductor device shown in FIG. 4A, a permissible width (corresponding to a permissible area 107 shown in FIG. 1) of the LSI chip is 25 $\mu$m. The permissible width of the semiconductor device shown in FIG. 4A is defined as the sum of 25 $\mu$m and the thickness of protective resin 4.

Explaining concretely, the LSI chips under a test are contained in trays and packed up together with shock-absorbing members. A dropping test is performed on the package of the semiconductor devices from a height of 0.7 mm. Moreover, the semiconductor device is transferred from a tray to another tray using a pincette supposing the worst condition that the semiconductor devices are mounted on the printed circuit board by the user.

Figure 12:
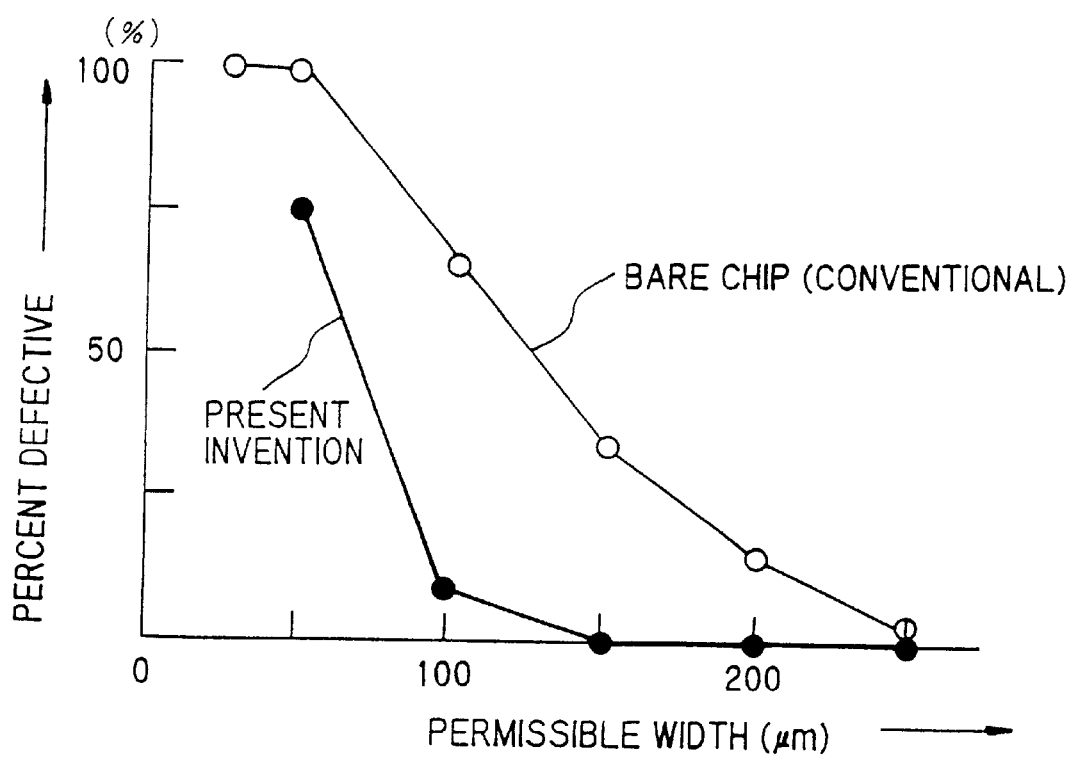
FIG. 12 shows a result of comparison made between a percent defective of semiconductor devices according to the invention and that of conventional semiconductor devices.

FIG. 12 shows relations between the permissible widths of the semiconductor devices and percent detectives of the semiconductor devices. A graph represented by black circles and segments of lines shows data of the semiconductor devices according to the invention shown in FIG. 4A, and another graph comprising white circles shows data of the conventional semiconductor device shown in FIG. 1. As shown in FIG. 12, the percent defective of the semiconductor device according to the invention shown in FIG. 4A decreases and yield rate of the same increases sharply as the permissible width increases. When the permissible width is more than 100 $\mu$m, the effect of the invention becomes further noticeable, that is to say, the semiconductor device according to the invention is far more excellent in the percentage detective and mechanical reliability than the conventional semiconductor device having the same dimensions.

In the semiconductor device submitted to the aforementioned test, although protective resin 4 is formed by potting, lattice-shaped sheets which are formed of resin and prepared previously may be inserted between the LSI chips, or the LSI chip may be covered with a thermocontracting film. Moreover, protective resin 4, 5, 6 may be replaced with rubber, elastomer, etc.

In the embodiments shown in FIGS. 7, 9 although the wafer is diced after the reverse surface thereof is coated with protective resin and grinded, the wafer may be diced before the reverse surface is grinded. In this case, the reverse surfaces of the LSI chips are grinded in a condition that the bump-mounting surfaces of the LSI chips are stuck to the adhesive sheet.

Although it is simple to conduct the steps of applying resin to the reverse surface, grinding the reverse surface, forming the bumps, etc. before the wafer is separated into the LSI chips, these steps may be conducted after the wafer is separated into the LSI chips, if restrictions are interposed on the provision for fabricating semiconductor device.

Although the wafer is diced after the reverse surface, which has been coated with resin, is grinded in the embodiments shown in FIGS. 7, 9, the wafer may be diced before the reverse surface is grinded. In this case, the reverse surfaces of the LSI chips are grinded in a state that the surfaces of the LSI chips, on which the bumps have formed, are stuck to the adhesive sheet.

As mentioned in the above, according to the semiconductor device according to the invention, since the chip is prevented from being damaged by providing protective members at least for the side surfaces of the bare chip, defects occurring at the time of transportation or mounting, or imperfections in a joint occurring at the time of mounting can be reduced, and reliability and yield rate of the products can be improved. Moreover, since the main part of the semiconductor device is the bare chip basically, there is no necessity for using interposer etc., and the number of parts or the step of the fabrication process can be reduced, hence cost of the semiconductor device can be cut down, the semiconductor device can be small-sized, and reliability of the semiconductor device can be improved.

Moreover, according to the method for fabricating the semiconductor device according to the invention, since the method comprises the steps of sticking the wafer on which plural bumps are formed to the adhesive sheet, fixing the periphery of the adhesive sheet to the fixing ring, dicing the wafer into the individuated chips, forming the spacings between the individuated chips by expanding the adhesive sheet at positions where the individuated chips adhere to the adhesive sheet, coating the spacings between the individuated chips with resin, hardening resin, and dicing the chips unified like a wafer at the spacings between the individuated chips, the separate chips do not pass through the fabrication process, the steps of handling the chips can be eliminated, the number of the steps in which the jigs and the tools are used is reduced, and the metallic mold becomes unnecessary in the steps molding resin, hence the investment for the provision and fabricating cost can be cut down. Moreover, since the LSI chip is prevented from being cracked by providing protective resin for the side surfaces of the LSI chip, reliability and yield rate of the semiconductor device are heightened.

Moreover, according to the other method for fabricating the semiconductor device, since the other method comprises the steps of sticking the wafer on which the intermediate electrodes for mounting the bumps are formed to the adhesive sheet, fixing the periphery of the adhesive sheet to the fixing ring, dicing the wafer into individuated chips, forming the spacings between the individuated chips by expanding the adhesive sheet, coating the spacings and the surfaces on which the intermediate electrodes are formed with resin, hardening resin, removing the chips unified like a wafer by hardening of resin from the adhesive sheet, grinding the surface of the unified chips till the intermediate electrodes are exposed, mounting the bumps on the grinded intermediate electrodes, sticking the unified chips to the adhesive sheet, and dicing the unified chips along boundary lines between the individuated chips, the separate chips do not pass through the fabrication process, the steps of handling the separate chips is eliminated, the number of the steps of using jigs and tools is reduced, the metallic mold becomes unnecessary in the step of molding resin, and the investment for the provision and fabrication cost can be reduced. Moreover, since the LSI chips are prevented from being cracked by providing protective resin for the side surfaces and the electrode-mounting surface of the LSI chip, reliability and yield rate of the semiconductor device can be heightened.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A semiconductor device, comprising
   a bare chip;
   plural bumps provided on an active surface of said bare chip; and
   protective members formed on side surfaces and on said active surface of said bare chip between said plural bumps,
   wherein said side surfaces of said protective members are substantially perpendicular to said active surface and a reverse surface opposite to said active surface of said bare chip, end surfaces of said protective members formed on said side surfaces of said bare chip and said reverse surface of said bare chip are on a common plane, and a sum of a thickness of each of said protective members formed on said side surfaces of said bare chip and a width of said bare chip is more than 100 $\mu$m.

2. The semiconductor device according to claim 1, wherein:
   said protective member is further formed entirely on said reverse surface of said bare chip.

3. The semiconductor device according to claim 1, wherein:
   said protective member is a resin.

4. The semiconductor device according to claim 1, wherein:
   said bare chip is provided with intermediate electrodes inserted between electrodes connected with circuit patterns of said bare chip and said bumps.

5. A semiconductor device, comprising:
   a bare chip;
   plural bumps provided on an active surface of said bare chip; and
   protective members formed on side surfaces of said bare chip to surround a periphery of said bare chip,
   wherein a sum of a thickness of each of said protective members and a width of said bare chip is more than 100 $\mu$m.

* * * * *